(12) United States Patent
Markert et al.

(10) Patent No.: US 7,656,697 B2
(45) Date of Patent: Feb. 2, 2010

(54) INTEGRATED CIRCUIT HAVING A RESISTIVELY SWITCHING MEMORY AND METHOD

(75) Inventors: Michael Markert, Augsburg (DE); Milena Dimitrova, Munich (DE); Heinz Hoenigschmid, Poecking (DE)

(73) Assignee: Qimonda AG, Munich (DE)

( * ) Notice: Subject to any disclaimer, the term of this patent is extended or adjusted under 35 U.S.C. 154(b) by 294 days.

(21) Appl. No.: 11/693,391

(22) Filed: Mar. 29, 2007

(65) Prior Publication Data

US 2008/0239788 A1    Oct. 2, 2008

(51) Int. Cl.
*G11C 11/00* (2006.01)
(52) U.S. Cl. ............... 365/148; 365/100; 365/163; 365/210.12
(58) Field of Classification Search ............ 365/148, 365/163, 100, 210.12
See application file for complete search history.

(56) References Cited

U.S. PATENT DOCUMENTS

| | | | |
|---|---|---|---|
| 6,961,277 B2* | 11/2005 | Moore et al. | 365/222 |
| 7,362,604 B2* | 4/2008 | Scheuerlein | 365/148 |
| 7,447,053 B2* | 11/2008 | Liaw et al. | 365/100 |
| 2006/0067147 A1* | 3/2006 | Roehr | 365/207 |
| 2006/0203542 A1 | 9/2006 | Kurotsuchi et al. | |
| 2007/0195580 A1* | 8/2007 | Hoenigschmid et al. | 365/148 |

\* cited by examiner

*Primary Examiner*—Pho M Luu
*Assistant Examiner*—Toan Le
(74) *Attorney, Agent, or Firm*—Dicke, Billig & Czaja, PLLC

(57) ABSTRACT

An integrated circuit having a resistance-based or resistively switching memory cell, and a method for operating a resistively switching memory cell is disclosed. One embodiment is adapted to be put in a low-resistance state by applying a first threshold voltage and in a high-resistance state by applying a second threshold voltage, wherein reading out of the data content from the memory cell is performed by applying a voltage to the memory cell in the range of the first or second threshold voltage or a higher voltage.

21 Claims, 5 Drawing Sheets

INTEGRATED CIRCUIT HAVING A RESISTIVELY SWITCHING MEMORY AND METHOD

BACKGROUND

The following statements relate to the technical field of integrated circuits having a resistance-based or resistively switching memory, and to a method for operating resistively switching memory.

As possible alternatives to common semiconductor memories such as DRAM, SRAM, or FLASH, resistance-based or resistive or resistively switching memory devices, in particular phase change memories (PCM), are known. In the case of phase change memories, a "active" or else "switching active" material or a phase change medium, respectively, is positioned between two electrodes (e.g., an anode and a cathode), e.g., a material with an appropriate chalcogenide compound (e.g., a Ge—Sb—Te or Ag—In—Sb—Te compound) that is capable of resistive switchability.

Such resistance-based memory technologies are used in the case of PCRAM (phase change random access memory) or CBRAM (conductive bridging random access memory). The exact functioning of such technologies will be explained in more detail in the following. In the case of other resistance-based memory technologies, the physical structure of the memory cell may be different vis-á-vis a CBRAM memory cell or a PCRAM memory cell, but the principle of writing, deleting, and reading of the cell content is similar in all cases.

In a phase change memory cell (PCRAM), the phase change material may be placed in an amorphous, relatively weakly conductive, or a crystalline, relatively strongly conductive, state by using appropriate switching processes. To cause, with a resistively switching phase memory cell, a change from an amorphous state with a relatively weak electric conductivity to a crystalline state with a relatively good electric conductivity of the switching-active material, an appropriate current pulse or voltage pulse, respectively, with a programming voltage may be applied to the electrodes, which results in that the switching-active material is heated beyond the crystallization temperature and crystallizes (programming process or writing process or SET process).

Vice versa, a change of state of the switching-active phase change material from a crystalline, i.e. relatively strong conductive state, to an amorphous, i.e. relatively weak conductive state, may be achieved by using an appropriate current pulse or voltage pulse, respectively, with a deleting voltage, the switching-active material is heated beyond the melting temperature and is subsequently quenched to an amorphous state by quick cooling (deleting process or RESET process).

The functioning of phase change memories is consequently based on the amorphous-crystalline phase transition of a phase change material, wherein the two states of a phase change memory cell, namely the amorphous, high-resistance state or the crystalline, low-resistance state, respectively, together represent one bit, i.e. a logic "1" or a logic "0". Thereby, the effect is utilized that the two phases of these compounds distinctly differ in their electric conductivity, and that the state of the phase change memory cell can thus be recognized again or be read out, respectively. The reading of the memory content may be performed by applying a voltage below the programming voltage and the deleting voltage, so that the data content of the memory cell is not changed.

The programming (programming process or writing process or SET process) of a memory cell being in the amorphous, high-resistance state to the low-resistance, crystalline phase is performed in that the material of the phase change memory is heated beyond the crystallization temperature and thus crystallized by using an electric heating pulse. The reverse process, i.e. the deleting process or RESET process, is realized in that the material is heated beyond the melting point of the phase change material by using a stronger heating pulse, i.e. with a higher energy introduction than with the write process or SET process, and that the amorphous, high-resistance state in the memory cell is recovered by the deleting voltage applied to the memory cell. Subsequently, the memory cell is quenched by a quick cooling in this amorphous, high-resistance state. The reading out of the data content of a PCRAM memory cell is usually performed by the applying of an electric voltage below the voltages that are necessary for achieving the crystallization or for melting the phase change material, so as not to change the data content.

In the case of CBRAM memory cells, an electrically conductive path can be generated by a positive voltage in an otherwise high-resistance material, wherein the memory cell assumes a low-resistance state. The programming process is reversible and can be reversed again in a deleting process with reverse polarity with negative voltage, so that it is possible to switch back and forth between a low-resistance and a high-resistance memory state of the memory cell. The physical processes related therewith will only occur from particular threshold voltages on, so that voltages below these threshold values may be used for reading the cell information. These processes for programming and deleting a CBRAM memory cell will be explained in more detail below by FIG. 1.

With such resistance-based memory technologies it is consequently possible to store information in a resistive memory cell by an electric resistance value. A particular, e.g., positive, threshold voltage is applied to the memory cell for writing the cell information, and a particular, e.g., negative, threshold voltage for deleting the cell information. For reading out the cell information, a lower read voltage is applied to the memory cell, wherein the current $I_{read}$ through the cell resulting from the applied read voltage is substantially smaller than the programming current $I_{set}$ and the deleting current $I_{reset}$. This may also be represented by the following relation equations:

$I_{read} < I_{set}$ and $I_{read} < I_{reset}$

In the case of conventional CBRAM memory cells, it was consequently necessary for the read voltage to keep a sufficient distance to the two threshold voltages (programming or deleting voltage) for reading out the cell information so as not to change the cell information during the read process. Typically, a conventional CBRAM memory cell has switch-on voltages of approx. 240 mV and switch-off voltages of approx. −80 mV. From this, there usually results a maximum read voltage of:

240 mV (threshold voltage)

−100 mV (safety difference)

=140 mV (maximum read voltage)

Thus, only short bit lines are possible with conventional CBRAM memory cells, and the low read voltage has to be amplified, which results in a higher switching effort with slower signal development and requires an own read voltage. Furthermore, a reading out of the data content from the CBRAM memory cell is practically not possible with a negative read voltage, since the threshold voltage for deleting the memory cell may be, for instance, only approx. −80 mV and this adds to approximately Zero with the safety difference of 100 mV. With a read voltage in the range of 0 mV, however, it is not possible to reliably determine data contents from the memory cell.

For these and other reasons, there is a need for the present invention.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1A:
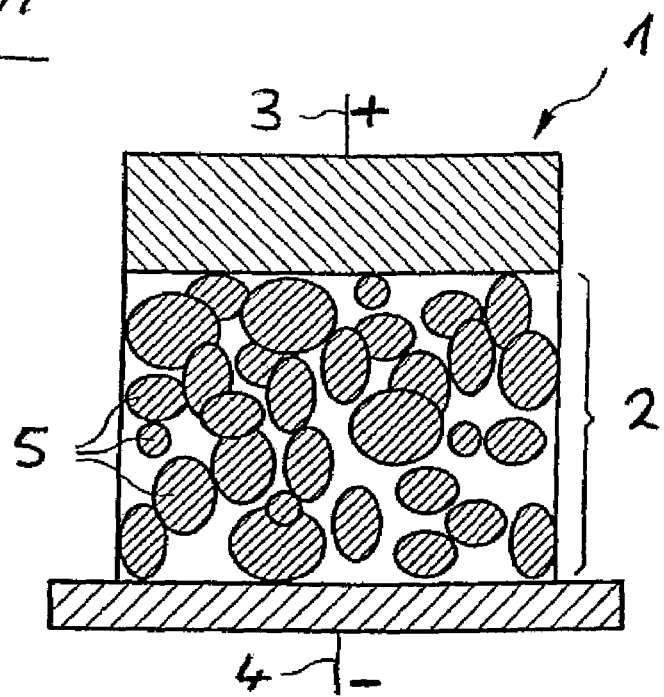
FIG. 1A illustrates a schematic integrated circuit having a CBRAM memory cell in a low-resistance state.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

One or more embodiments provide a method for operating a resistively switching memory cell that is configured to be put in a low-resistance state by applying a first threshold voltage and in a high-resistance state by applying a second threshold voltage, wherein reading out of the data content from the memory cell is performed by applying a voltage to the memory cell in the range of the first or second threshold voltage or a higher voltage.

The first threshold voltage may be a positive threshold voltage or a programming voltage that puts the memory cell in a low-resistance state. The second threshold voltage may be a negative threshold voltage or a deleting voltage that puts the memory cell in a high-resistance state.

In principle, the present invention solves the above-mentioned problems in that a "destructive read", i.e. a deleting or a writing read process, is admitted and performed during the reading out of the data content in a resistively switching memory cell. In this, during reading (sensing) of the cell information, a voltage, for instance, in the range of the positive threshold voltage (programming voltage) is applied to the memory cell, which is also used for programming the data content of the memory cell or for generating a low-resistance state of the memory cell, respectively.

During the deleting or writing read process, a voltage in the range of the negative threshold voltage (deleting voltage) may be applied to the memory cell, which is also used for deleting the data content of the memory cell or for generating a high-resistance state of the memory cell. The voltage for performing the deleting or writing read process applied to the memory cell may even range above the programming voltage or below the deleting voltage.

In the present description, this read process is referred to as deleting or writing read process or "destructive read", respectively, since the data content of the memory cell may first be lost because the cell information may be deleted or modified due to the positive or negative threshold voltage applied to the memory cell. However, since the data content of the memory cell was read out during the read process prior to being changed, the corresponding cell information can be programmed into the memory cell again after the read process.

Accordingly, a deleting or writing read process ("destructive read") that changes the data content of the memory cell is performed during the reading out of the data content from a resistively switching memory cell. Subsequently, the cell information that was read out before can be programmed into the corresponding memory cell again by recovering the previous data content, i.e. the previous state with respect to the electric conductivity of the memory cell.

The recovery of the data content of the memory cell prior to the read process may be performed by applying a first threshold voltage in the form of a programming voltage to the electrodes of the memory cell so as to produce a low-resistance state in the memory cell if the memory cell had a low-resistance state prior to the deleting read process. If the memory cell had a high-resistance state prior to the deleting or writing read process, the recovery of the data content of the memory cell may be performed by applying a second threshold voltage in the form of a deleting voltage to the electrodes of the memory cell so as to recover a high-resistance state in the memory cell.

During the reading of a memory cell in a high-resistance state by using a programming voltage, it becomes lowly resistive. During the reading of a memory cell in a high-resistance state by using a deleting voltage, it remains highly resistive. This means that, depending on the applied read voltage, a deleting of the memory cell may—but need not—be performed during the reading of a high-resistance memory cell. This differentiation may be made depending on what is better to realize with the available logic of the memory.

One or more embodiments are based on:

performing the reading out of the cell information by a deleting or writing read process ("destructive read"), performing the reading out of the cell information by the deleting voltage or by the programming voltage, which is enabled by a), and programming the read out cell information again into the corresponding memory cell after the read process by using an appropriate write voltage or an appropriate deleting voltage.

The present embodiments provide a higher read voltage can be applied to the resistance-based memory cell, which enables a more reliable signal interpretation ("signal margin"). Furthermore, with a resistively switching memory, longer bit lines may be realized in a memory cell field due to the higher read voltages, which may result in a better utilization of the memory area ("cell efficiency"). In the case of the inventive memory, no own read voltage that differs from the programming voltage and from the deleting voltage is required, so that the switching effort may be reduced due to simpler wiring ("power wiring"). Thus, the necessity for the installation of circuits for generating the read voltage can further be omitted.

During the reading of the data content with the programming voltage from a memory cell in a low-resistance state, the memory cell is again programmed with the same data content. Thus, the cell information is refreshed or maintained. In the case of a CBRAM memory cell, a "overprogramming" may occur in that the memory cell is charged with too many electric charge carriers. If, however, too many charge carriers are present in the memory cell, the deleting of the corresponding memory cell may become impossible.

In accordance with one embodiment, the reading of the data content from a low-resistance memory cell may therefore be performed by a limitation of the read current, so that the current flowing through the memory cell during the read process can be limited. Thus, the "overprogramming" of the memory cell can be avoided. During the reading of a high-resistance memory cell with the programming voltage, it becomes lowly resistive, so that a subsequent deleting process has to take place. In both cases, a refresh of the data content of the memory cell takes place, so that a possible loss of information by ageing of the memory cell can be avoided.

Alternatively, a voltage pulse that is of such a short duration that the data content of the memory cell is not changed can be applied to the memory cell for reading out the data content. Resistively switching memory cells have a certain inertia, which means that a change of their conductivity and thus of the data content takes place, even if a sufficiently high threshold voltage (programming or deleting voltage) is applied, after a particular reaction time only.

This inertia may be utilized such that, even if the voltage pulse for reading out the data content of the memory cell is in the range of or above one of the threshold voltages, the voltage pulse is chosen sufficiently long to reliably read the data content. The voltage pulse is, however, applied to the memory cell for such a short period (below the reaction time of the memory cell) only that the memory cell does not change its state and the data content is thus maintained unchanged. In this case, no programming write process is required after the reading of the data content.

In accordance one embodiment, the deleting or writing read process enables a reading out of the cell information both with a programming voltage in the range of the positive threshold voltage or above, and with a negative read voltage in the range of the negative threshold voltage or higher, i.e. a negative voltage with a higher absolute value than the negative threshold voltage.

The reading out of the data content of the memory cell may be performed by applying a voltage to the memory cell in the range of a deleting voltage or by applying a voltage in the range of a programming voltage. Alternatively, the reading out of the data content of the memory cell may be performed by applying a voltage to the memory cell in the range above a positive threshold voltage or by applying a voltage in the range below a negative threshold voltage.

During the reading of a low-resistance memory cell with the deleting voltage, it becomes highly resistive, i.e. a subsequent programming process has to be performed to recover the original data content of the corresponding memory cell. Since the memory cell is not written again, but deleted during the inventive read process, the "overprogramming" can automatically be avoided. The following case distinctions can be made when reading a CBRAM memory cell:

1. If the deleting read process was performed with a programming voltage and the memory cell had a low-resistance state prior to the deleting read process, no more programming process for recovery of the data content of the memory cell has to be performed after the read process, since the read process was performed with the programming voltage and this causes a low-resistance state of the memory cell, anyway.

2. If the deleting read process was performed with a deleting voltage and the memory cell had a low-resistance state prior to the deleting read process, a programming process for recovery of the data content of the memory cell has to be performed by the programming voltage after the read process, since the read process with the deleting voltage causes a high-resistance state of the memory cell.

3. If the deleting or writing read process was performed with a programming voltage and the memory cell had a high-resistance state prior to the writing read process, a programming process for recovery of the data content of the memory cell has to be performed by the deleting voltage after the read process, since the read process with the programming voltage causes a low-resistance state of the memory cell.

4. If the deleting or writing read process was performed with a deleting voltage and the memory cell had a high-resistance state prior to the deleting read process, no more programming process for recovery of the data content of the memory cell has to be performed after the read process, since the read process was performed with the deleting voltage and this causes a high-resistance state of the memory cell, anyway.

These processes may be performed by a correspondingly designed control unit that is designed to charge a number of memory cells with electric voltages by which the data content of memory cells can be programmed, read, or deleted. The control unit causes in particular the reading out of the data content of the memory cell by applying a voltage to a memory cell in the range of the positive threshold voltage or higher, or by applying a voltage in the range of the negative threshold voltage or lower, i.e. a negative voltage with a higher absolute value than the negative threshold voltage.

In the following, one or more embodiments will be explained in more detail.

FIG. 1A illustrates the schematic structure of an integrated circuit having a CBRAM memory cell 1 in a highly conductive or low-resistance state, respectively. The CBRAM memory cell 1 includes a layer 2 of a material with resistively switching properties, e.g., a chalcogenide material that may be, for instance, manufactured of GeSe, GeS, SiSe, SiS, and/or AgSe or Ag—S. The chalcogenide material includes a metallic material with the required solubility and high mobility within the chalcogenide material, such as Cu, Ag, Au or Zn ions that were diffused or doped into the chalcogenide material. Consequently, the chalcogenide material layer 2 has the property of forming conductive bridges ("conductive bridging"). Thus, the nanostructure of the chalcogenide material layer 2 becomes heterogeneous with respect to the chemical composition and the electric properties. In other embodiments, the material of layer 2 is a chalcogenide free material.

The CBRAM memory cell 1 further includes two electrodes 3 and 4 that are added to the chalcogenide layer 2 and are in electric contact therewith. The chalcogenide material layer 2 is in direct contact with both electrodes 3 and 4, while the two electrodes 3 and 4 neither have a direct electric contact nor an interface with each other, so that the chalcogenide material layer 2 separates the two electrodes 3, 4 from one another. Via the electrodes 3 and 4, electric current or voltage pulses may be applied to the chalcogenide material layer 2. Furthermore, the electrodes 3, 4 are each connected with metal lines or metal connections (not illustrated) so as to electrically connect the CBRAM memory cell with other devices, e.g., transistors or other CBRAM memory cells.

The first electrode 3 which is, like the second electrode 4, in direct contact with the chalcogenide material, may be manufactured of the movable material, e.g., of Cu, Ag, Au, or Zn, so as to serve as an ion donor for the chalcogenide material layer 2. The second electrode 4 may be manufactured of a semiconductive or metallic material that neither has a significant solubility nor a significant mobility in the chalcogenide material, so that the material of the second electrode 4 does not penetrate the chalcogenide material layer 2 significantly and does not intermix therewith. Therefore, the second electrode 4 is manufactured of an inert material such as W, Ti, Ta, TiN, Pt, or doped Si, TaN, AL.

The atoms of the metallic material in the chalcogenide material may form metal-rich deposits or conglomerates 5. These metal-rich deposits 5 are cluster-like, amorphous or nanocrystalline aggregations in which the metallic material is enriched. The resistive memory switching mechanism of the CBRAM memory cell 1 is substantially based on a variation of the concentration of the metallic material that is incorporated in the chalcogenide material layer 2.

As described above, the electric resistance of the resistively switching memory cell 1 may vary over several magnitudes from a high resistance (i.e. exhibiting an isolating or semiconductive behavior) to small resistance values that are by some magnitudes smaller. This great resistance variation is caused by local variations of the chemical composition of the chalcogenide material layer 2 on a nanostructural basis.

On the basis of a chalcogenide material layer 2 with a variable amount of metallic atoms together with cluster-like amorphous or nanocrystalline aggregations 5, a wide resistance switching behavior of the CBRAM memory cell 1 can be achieved. The variation of the total amount of the deposits 5 present in the chalcogenide material layer 2 enables a quick modification of the physical and in particular the electric properties of the CBRAM memory cell 1. The resistive switching mechanism is based on the statistical bridge formation of multiple metal-rich deposits 5 within the chalcogenide material layer 2.

For programming the memory cell 1, the top electrode 3 may be charged with a positive voltage, and the bottom electrode 4, for instance, with a programming voltage with corresponding polarity. In the illustrated example, the top electrode 3 is charged with a positive voltage and the bottom electrode 4 with a smaller voltage than this positive voltage, or with a negative voltage. Thus, mobile metal ions penetrate the chalcogenide material layer 2 from the top electrode 3 and electrons from the bottom electrode 4.

Due to the continued application of an electric writing pulse by the programming voltage to the CBRAM memory cell 1, these deposits 5 continue to grow in density until they eventually get in contact. Thereby, a conductive bridge may form through the entire memory cell 1, which results in a higher electric conductivity through a metallic connection between the two electrodes 3 and 4 of the memory cell 1. This process serves the programming of the memory cell 1 and produces a situation with high conductivity between the electrodes 3 and 4, which thus constitutes the highly conductive or low-resistance state of the memory cell 1. This state may be maintained for a lengthy storage time, so that the non-volatility of the programming is ensured.

Figure 1B:
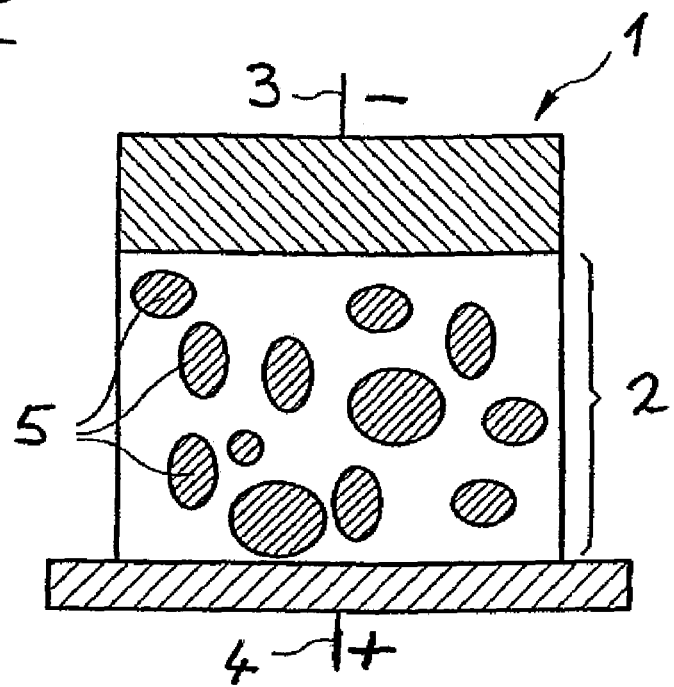
FIG. 1B illustrates a schematic integrated circuit having a CBRAM memory cell in a high-resistance state.

FIG. 1B illustrates a schematic of an integrated circuit having a CBRAM memory cell in a lowly conductive or high-resistance state. The above-described programming of the memory cell 1 in a highly conductive or low-resistance state is reversible. To this end, a voltage (deleting voltage) that is inverse to the voltage for the programming process is applied to the electrodes 3, 4 of the memory cell 1, wherein, in the illustrated example, the top electrode 3 is charged with a negative voltage and the bottom electrode 4 with a positive voltage. Thus, the mobile metal ions are drawn out from the chalcogenide material layer 2 via the negatively charged top electrode 3 and the electrons are drawn out from the chalcogenide material layer 2 via the positively charged bottom electrode 4.

The drawing out of the mobile metal ions from the chalcogenide material layer 2 causes a reduction of the number and size of the metal-rich deposits 5 in the chalcogenide material. The electric bridging of the chalcogenide material layer 2 is reduced in that the distances between the deposits 5 are enlarged. This way, the isolated deposits 5 are no longer in contact with each other and do no longer form an electrically conductive bridge through the previously highly conductive or low-resistance chalcogenide material layer 2. This process results in the deletion of the memory cell 1 and produces a situation with low conductivity between the electrodes 3 and 4, which constitutes the lowly conductive or high-resistance state of the memory cell 1.

Figure 2:
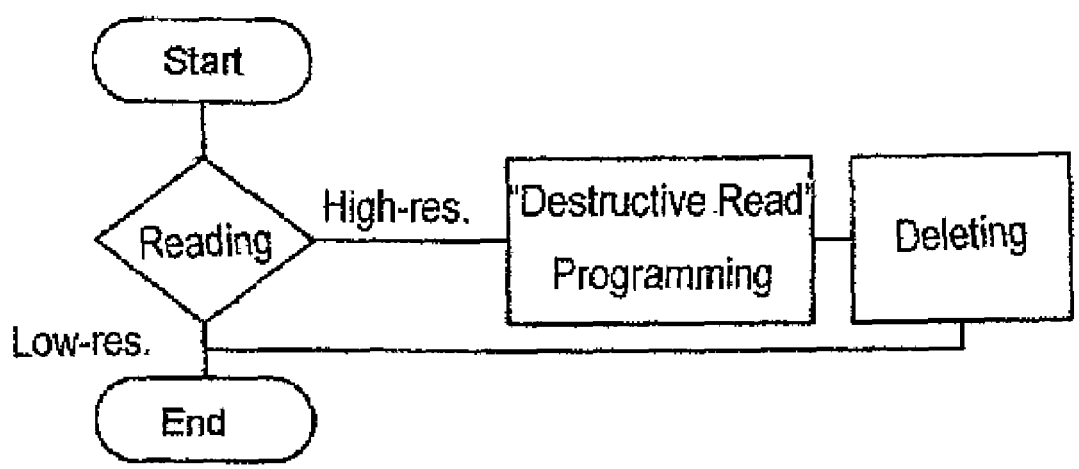
FIG. 2 illustrates a flowchart for illustrating the processes during the reading of a resistively switching memory cell by programming voltage in accordance with the method according to one embodiment.

FIG. 2 illustrates a flowchart for illustrating the processes during the reading of a resistively switching memory cell by programming voltage in accordance with one embodiment of the present invention. As is illustrated in the flowchart of FIG. 2, the data content of the memory cell is first of all read (sensed) during a deleting or writing read process by programming voltage. Subsequently, an appropriate case distinction may be made for the further procedure depending on the data content of the memory cell.

If the memory cell had a low-resistance state prior to the writing read process, no more programming process has to be performed for recovery of the data content of the memory cell after the read process, since the read process was performed with the programming voltage and this leaves a low-resistance state of the memory cell, anyway.

If, however, the memory cell had a high-resistance state prior to the writing read process, a programming process by a deleting voltage has to be performed after the read process for recovery of the data content of the memory cell before the read process, since the read process with the programming voltage caused a low-resistance state of the memory cell. For recovery of the data content of the memory cell prior to the read process, a negative deleting voltage may be, for instance, applied to the memory cell, which causes a high-resistance state of the memory cell. This way, the data content of the memory cell is read out by programming voltage, and the state of the memory cell prior to the writing read process is recovered.

Figure 3:
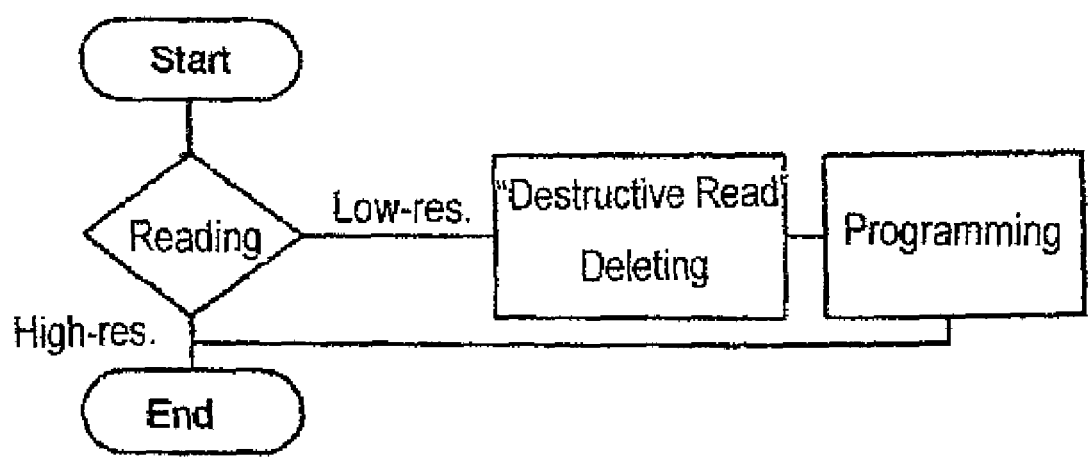
FIG. 3 illustrates a flowchart for illustrating the processes during the reading of a resistively switching memory cell by deleting voltage in accordance with the method according to one embodiment.

FIG. 3 illustrates a flowchart for illustrating the processes during the reading of a resistively switching memory cell by deleting voltage in accordance with the method according to one embodiment. As illustrated in the flowchart of FIG. 3, the data content of the memory cell is first of all read (sensed) during a deleting read process by deleting voltage. Subsequently, an appropriate case distinction may be made for the further procedure depending on the data content of the memory cell.

If the memory cell had a high-resistance state prior to the deleting read process, no more programming process for recovery of the data content of the memory cell has to be performed after the read process, since the read process was performed with the deleting voltage and this leaves a high-resistance state of the memory cell, anyway.

If, however, the memory cell had a low-resistance state prior to the deleting read process, a programming process for recovery of the data content of the memory cell has to be performed by programming voltage after the read process, since the read process with the deleting voltage caused a high-resistance state of the memory cell. For recovery of the data content of the memory cell prior to the read process, for instance, the programming voltage may be applied to the memory cell that causes a low-resistance state of the memory cell. This way, the data content of the memory cell is read out by deleting voltage, and the state of the memory cell prior to the deleting read process is recovered.

Figures 4A, 4B:
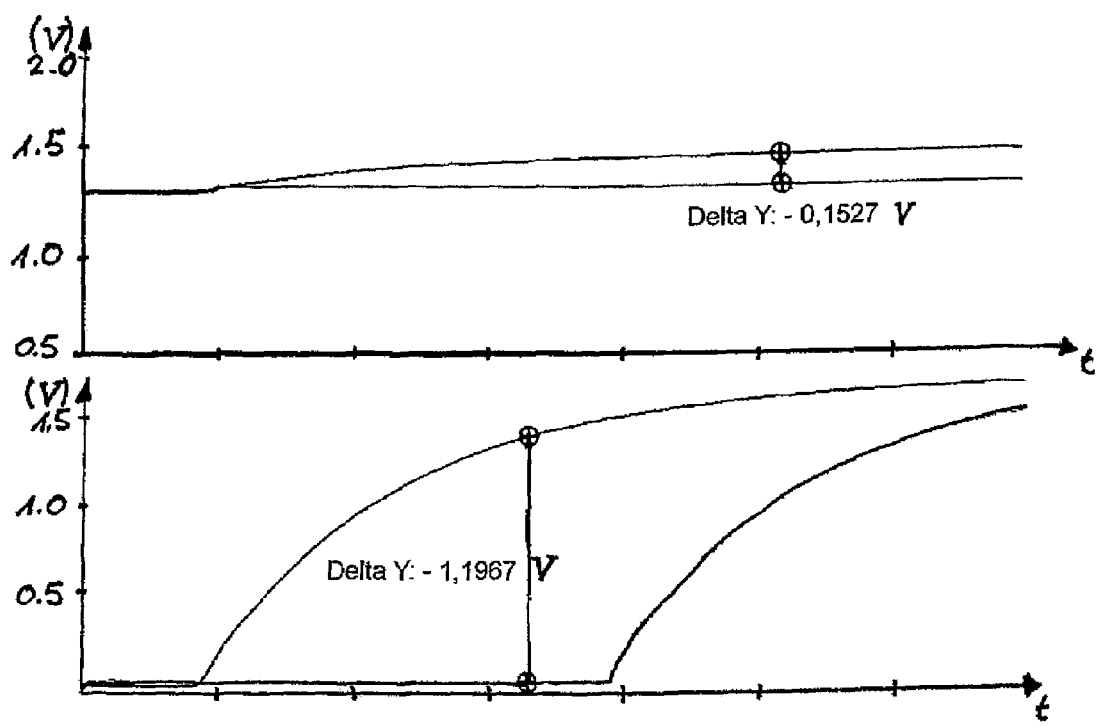
FIGS. 4A and 4B each illustrate diagrams with a signal progression over time as it may occur during the reading of a high-resistance and a low-resistance memory cell with different read voltages in accordance with one embodiment.

FIGS. 4A and 4B each illustrate diagrams with a signal progression over time as it occurs during the reading of a high-resistance and a low-resistance memory cell with different read voltages in accordance with one method according to one embodiment. The upper diagram illustrates the time signal progression that occurs during the reading of a high-resistance and a low-resistance memory cell with a read voltage of 200 mV. In the case of the high-resistance memory cell, the signal remains on the "clamp voltage" of 1.3 V whereas, in the case of the low-resistance memory cell, the signal slowly increases to the "plate voltage" of 1.5 V. The reference signal or the reference voltage, respectively, for the correct evaluation of the memory cell content lies approximately in the middle between the "clamp voltage" and the "plate voltage", i.e. at approx. 1.4 V. For the reading out of the data content from the memory cell (sensing), a difference of approx. 0.075 V thus remains between the read signal voltages.

FIG. 4B illustrates the time signal progression that occurs during the reading of a high-resistance and a low-resistance memory cell with a read voltage of 1.5 V in accordance with one embodiment. In the case of the high-resistance memory cell the signal remains on the "clamp voltage" of 0 V until the time at which the memory cell switches resistively, i.e. changes its electric resistance. Subsequently, the voltage of the signal migrates in the direction of the "plate voltage" of 1.5 V. In the case of the low-resistance memory cell, the signal migrates to the "plate voltage" of 1.5 V. The reference voltage for the correct evaluation of the memory cell content lies again approximately in the middle between the "clamp voltage" and the "plate voltage".

With the application example illustrated in FIG. 4B, the reference voltage might therefore be at approx. 0.6 V, so that a signal difference of approx. 0.6 V then remains for the reading out of the data content from the memory cell ("sensing"). The amount of the signal difference also depends on the switching rate of the memory cell. Conventional memory technologies with slowly switching memory cells entail a larger signal difference.

Figure 5:
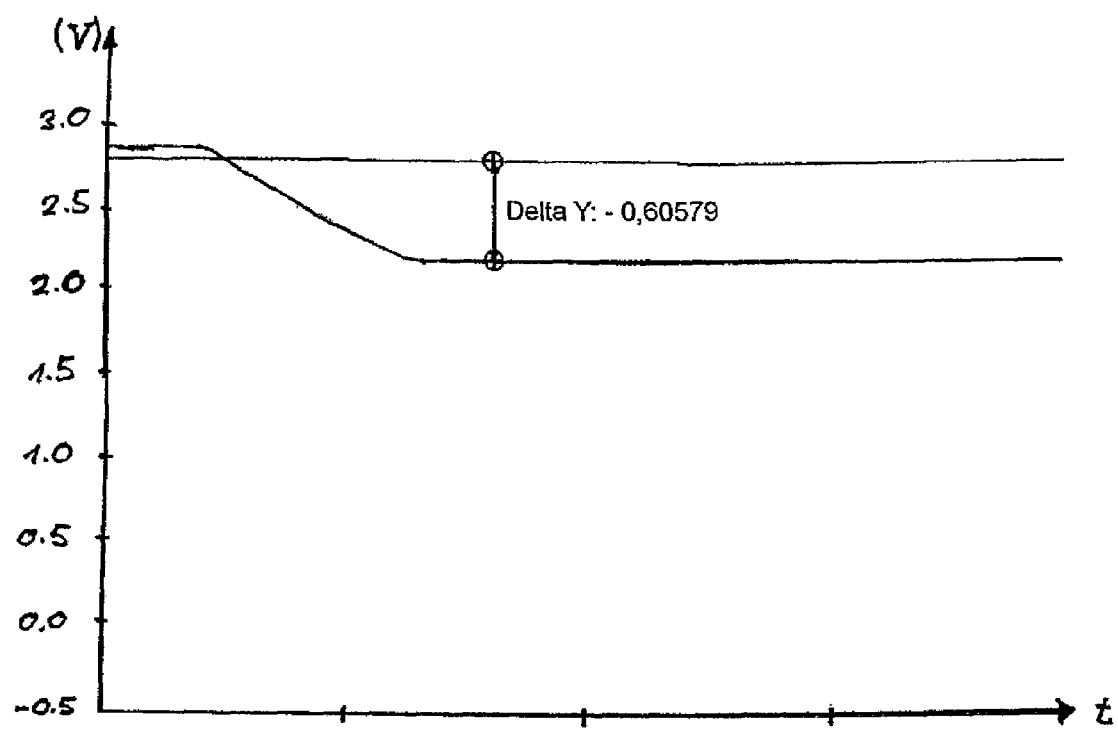
FIG. 5 illustrates a diagram with a signal progression over time as it may occur during the reading of a high-resistance and a low-resistance memory cell with a read voltage of −1.5 V in accordance with one embodiment.

FIG. 5 illustrates a diagram with a signal progression over time as it occurs during the reading of a high-resistance and a low-resistance memory cell with a read voltage of −1.5 V in accordance with one embodiment. In the case of the high-resistance memory cell, the signal remains on the "clamp voltage" of approx. 3 V. In the case of the low-resistance memory cell, the signal migrates in the direction of "plate voltage" of approx. 1.5 V until the time at which the resistive memory cell switches, with its electric resistance strongly changing.

In the application example illustrated in FIG. 5, the reference voltage might be at 2.6 V, so that a signal difference of approx. 0.3 V remains for the reading out of the data content from the memory cell ("sensing"). The amount of the signal difference again also depends on the switching rate of the memory cell, wherein memory technologies with slowly switching memory cells may entail a larger signal difference.

The reading out of the cell information with negative voltage may also entail less current consumption. During the reading of a low-resistance memory cell with positive voltage, electric current will flow throughout the entire read process. During the reading of a high-resistance memory cell with positive voltage, current flows as soon as the memory cell becomes lowly resistive, and during the subsequent deleting process the memory cell is charged with current until it becomes highly resistive again.

During the reading of a low-resistance memory cell with negative voltage, current may flow until the memory cell becomes highly resistive, and during the subsequent programming the memory cell may be charged with current until it becomes lowly resistive again. The current consumption is thus comparable with the reading of a high-resistance memory cell with positive voltage. Thus, during the reading of a high-resistance memory cell with negative voltage no current flows.

One or more embodiments can also be applied to resistively switching memory cells that are adapted to be operated in a multi level mode. The memory cell may be put in different low-resistance states by applying different positive threshold voltages. Different high-resistance states may be generated in the memory cell by applying different negative threshold voltages. This way, more than one low-resistance and more than just one high-resistance state can be generated in the resistively switching memory cell. By this multi level operation, more than two different memory states can be generated in one resistively switching memory cell, and thus more than just one bit can be stored in one memory cell.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for operating an integrated circuit having a resistively switching memory cell comprising:
   applying a first threshold voltage to put the memory cell in a low-resistance state;
   applying a second threshold voltage to put the memory cell in a high-resistance state; and
   performing reading out of the data content from the memory cell by applying the first or second threshold voltage or a voltage with a higher absolute value than the first or second threshold voltage to the memory cell.

2. The method of claim 1, comprising:
   performing the reading out of the data content of the memory cell by a deleting read process by applying a voltage to the memory cell in the range of a deleting voltage.

3. The method of claim 1, comprising:
   performing the reading out of the data content of the memory cell by a writing read process by applying a voltage to the memory cell in the range of a programming voltage.

4. The method of claim 1, comprising:
   performing the reading out of the data content of the memory cell by applying a voltage to the memory cell in the range above a positive threshold voltage.

5. The method of claim 1, comprising:
   performing the reading out of the data content of the memory cell by applying a voltage to the memory cell in the range below a negative threshold voltage.

6. The method of claim 1, comprising:
   for reading out the data content, applying a voltage pulse to the memory cell which is of a sufficiently short duration that the data content of the memory cell remains unchanged.

7. The method of claim 1 comprising:
   after the reading out of the data content from the memory cell, programming the respective read out data content is again into the memory cell by applying the first threshold voltage to the memory cell.

8. The method of claim 1, comprising:

after the reading out of the data content from the memory cell, programming the respective read out data content is again into the memory cell by applying the second threshold voltage to the memory cell.

9. The method of claim 1, comprising:

wherein, after the reading out, corresponding to the read out data content of the memory cell, generating a low-resistance state of the memory cell by applying the first threshold voltage to the memory cell, or generating a high-resistance state of the memory cell by applying the second threshold voltage to the memory cell.

10. The method of claim 1 comprising:

wherein, by applying different positive or different negative threshold voltages, different low-resistance or different high-resistance states can be generated in the memory cell.

11. The method of claim 1 comprising:

after the reading out of the data content from the memory cell, programming the read out data content is again into the memory cell by applying a corresponding threshold voltage to the memory cell.

12. The method of claim 1 comprising:

wherein, during the reading out of the data content from the memory cell which is in a high-resistive state, the memory cell is charged with a positive threshold voltage until the memory cell becomes lowly resistive, and wherein, during the subsequent programming process, the memory cell is charged with a negative threshold voltage until it becomes highly resistive again.

13. The method of claim 1 comprising:

wherein, during the reading out of the data content from the memory cell which is in a low-resistance state, the memory cell becomes highly resistive by a negative threshold voltage, and wherein, during the subsequent programming process, the memory cell is charged with a positive threshold voltage until it becomes lowly resistive again.

14. The method of claim 1 comprising:

wherein, during the reading out of the data content from the memory cell which is in a low-resistance state, the memory cell is charged with a positive voltage, so that an electric current flows through the memory cell throughout the entire reading process.

15. The method of claim 1, comprising:

performing the reading out of the data content from the memory cell is performed by limitation of the current that flows through the memory cell during the read process.

16. An integrated circuit having a resistively switching memory comprising:

a resistively switching memory cell configured to be put in a low-resistance state by applying a first threshold voltage and in a high-resistance state by applying a second threshold voltage; and wherein the data content of the memory cell is configured to be readable by applying the first or second threshold voltage or a voltage with a higher absolute value than the first or second threshold voltage to the memory cell.

17. The integrated circuit of claim 16, comprising:

wherein a reference voltage of the resistively switching memory cell for evaluating the read out data content of the memory cell lies approximately in the middle between a "clamp voltage" and a "plate voltage" of the memory cell.

18. The integrated circuit of claim 16, comprising:

wherein the resistively switching memory cell is designed as PCRAM memory cell or as CBRAM memory cell.

19. The integrated circuit 16, comprising:

wherein different low-resistance or different high-resistance states can be generated in the memory cell by applying different positive or different negative threshold voltages.

20. The integrated circuit 16 comprising:

wherein, after the reading out of the data content from the memory cell, the respective read out content can again be programmed into the memory cell by applying a corresponding threshold voltage to the memory cell.

21. A memory system comprising:

a number of resistively switching memory cells that are adapted to be put in a low-resistance state by applying a first threshold voltage and in a high-resistance state by applying a second threshold voltage; and a control unit configured to charge the individual memory cells with electric voltages, by which the data content of the memory cells can be programmed, read, or deleted, wherein the control unit performs the reading out of the data content of the memory cell by applying the first or second threshold voltage or a voltage with a higher absolute value than the first or second threshold voltage to the memory cell.

* * * * *